United States Patent
Hur et al.

(10) Patent No.: US 7,616,022 B2
(45) Date of Patent: Nov. 10, 2009

(54) CIRCUIT AND METHOD FOR DETECTING SKEW OF TRANSISTORS IN A SEMICONDUCTOR DEVICE

(75) Inventors: Hwang Hur, Ichon-shi (KR); Jun-Gi Choi, Ichon-shi (KR)

(73) Assignee: Hynix Semiconductor Inc., Ichon-shi, Kyungki-do (KR)

( * ) Notice: Subject to any disclaimer, the term of this patent is extended or adjusted under 35 U.S.C. 154(b) by 94 days.

(21) Appl. No.: 11/892,584

(22) Filed: Aug. 24, 2007

(65) Prior Publication Data

US 2008/0174336 A1    Jul. 24, 2008

Related U.S. Application Data

(62) Division of application No. 11/019,395, filed on Dec. 23, 2004, now Pat. No. 7,276,930.

(30) Foreign Application Priority Data

Apr. 27, 2004    (KR) .............................. 2004-29065

(51) Int. Cl.
    *G01R 31/26*    (2006.01)
(52) U.S. Cl. ......................... 324/769; 324/65
(58) Field of Classification Search .................. 324/65; 714/700, 769; 327/333, 108
    See application file for complete search history.

(56) References Cited

U.S. PATENT DOCUMENTS

| | | | |
|---|---|---|---|
| 5,304,865 A * | 4/1994 | Schoofs ....................... 327/77 |
| 5,963,079 A | 10/1999 | Hoang | |
| 6,014,053 A | 1/2000 | Womack | |
| 6,201,746 B1 * | 3/2001 | Koo et al. ..................... 365/201 |
| 6,469,550 B1 | 10/2002 | Kurd | |
| 6,822,490 B2 * | 11/2004 | Hyun et al. .................. 327/108 |
| 6,862,375 B1 | 3/2005 | Keithley et al. | |
| 6,967,516 B2 | 11/2005 | Okayasu | |
| 7,053,672 B2 * | 5/2006 | Choi ........................... 327/65 |
| 7,065,168 B2 | 6/2006 | Dedic et al. | |
| 7,276,930 B2 * | 10/2007 | Hur et al. ..................... 324/769 |
| 2002/0087922 A1 * | 7/2002 | Glenn et al. ................. 714/700 |
| 2006/0010358 A1 * | 1/2006 | Miller ......................... 714/700 |

FOREIGN PATENT DOCUMENTS

JP    11-161988    6/1999

* cited by examiner

*Primary Examiner*—Ha Tran T Nguyen
*Assistant Examiner*—Richard Isla Rodas
(74) *Attorney, Agent, or Firm*—Lowe Hauptman Ham & Berner, LLP

(57) ABSTRACT

A circuit and method for easily detecting skew of a transistor within a semiconductor device are provided. The circuit for detecting the skew of the transistor includes a linear voltage generating unit for outputting a linear voltage by using a first supply voltage, a first attenuation unit for reducing variation width of the linear voltage according to the performance of the transistor, a saturation voltage generating unit for outputting a saturation voltage by using a second supply voltage, and a comparison unit for comparing an output of the first attenuation unit and the saturation voltage.

14 Claims, 3 Drawing Sheets

CIRCUIT AND METHOD FOR DETECTING SKEW OF TRANSISTORS IN A SEMICONDUCTOR DEVICE

CROSS REFERENCE TO RELATED APPLICATION

This application is a divisional of U.S. Ser. No. 11/019,395, filed on Dec. 23, 2004 now U.S. Pat. No. 7,276,930. This application, in its entirety, is incorporated herein by reference.

FIELD OF THE INVENTION

The present invention relates to a circuit for detecting skew of a transistor used in semiconductor memory devices.

BACKGROUND OF THE INVENTION

In general, as a semiconductor device is scaled down, property variation of a MOS transistor is getting larger according to skew and temperature since it is difficult to control device parameters and manufacturing processes which determine the performance of the MOS transistor. For instance, the manufacturing processes and device parameters include width and length of a transistor gate, thickness of a gate oxide, and a seat resistor and so on. As the size of the transistor is smaller, target values of those parameters become lower and, thus, tolerance to a target value of each process increases and the property variation of the transistor also becomes larger. Therefore, it is preferable that circuits within the semiconductor device are designed to operate without being effected by the variation of the transistor due to the skew and temperature. However, it is getting difficult to design circuits that have immunity from the increasing variation of the transistor.

SUMMARY OF THE INVENTION

It is, therefore, a primary object of the present invention to provide a circuit and method for detecting skew of a transistor within a semiconductor device.

In accordance with one aspect of the present invention, there is provided a circuit for detecting skew of a transistor comprising: a linear voltage generating unit for outputting a linear voltage by using a first supply voltage; a first attenuation unit for reducing variation width of the linear voltage according to the performance of the transistor; a saturation voltage generating unit for outputting a saturation voltage by using a second supply voltage; and a comparison unit for comparing an output of the first attenuation unit and the saturation voltage.

Preferably, the first supply voltage has a lower voltage level than the second supply voltage.

Meanwhile, in order to easily the output of the first attenuation unit and the saturation voltage, it is preferable that the circuit further comprises a voltage adjusting unit for adjusting the output of the first attenuation unit to a certain voltage level.

It is preferable to further comprise a second attenuation unit connected to an output node of the saturation voltage generating unit so as to achieve precise comparison at the comparison unit.

In accordance with another aspect of the present invention, there is provided a circuit for detecting skew of a transistor comprising: a linear voltage generating unit for outputting a linear voltage by using a first supply voltage; a first attenuation unit for reducing variation width of the linear voltage according to the performance of the transistor; a saturation voltage generating unit for outputting a saturation voltage by using a second supply voltage whose level is higher than that of the first supply voltage; a voltage adjusting unit for adjusting an output of the first attenuation unit to a certain voltage level so as to easily compare said output with the saturation voltage; and a comparison unit for comparing an output of the voltage adjusting unit and the saturation voltage.

Preferably, the linear voltage generating unit can include an upper NMOS transistor having a drain coupled with the first supply voltage and a gate receiving the second supply voltage, and a lower NMOS transistor having a drain connected to a source of the upper NMOS transistor, a gate receiving the first supply voltage and a source coupled with a ground voltage, and the saturation voltage generating unit can include an upper NMOS transistor having a drain coupled with the second supply voltage and a gate receiving the second supply voltage, and a lower NMOS transistor having a drain connected to a source of the upper NMOS transistor, a gate receiving the first supply voltage and a source coupled with the ground voltage.

In accordance with the other aspect of the present invention, there is provided a method for detecting skew of transistor, which comprises the steps of: generating a linear voltage by using a first supply voltage; reducing variation width of the linear voltage according to the performance of the transistor, thereby outputting an attenuated linear voltage; producing a saturation voltage by using a second supply voltage; and comparing the attenuated linear voltage and the saturation voltage.

The present invention detects the skew of the transistor in the semiconductor device by using operational performance of the transistor that has large current variation in a saturation region while it has small current variation in a linear region according to skew move and temperature change.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, with reference to the drawings, some of the preferred embodiments of the present invention will be explained in detail.

Figure 1:
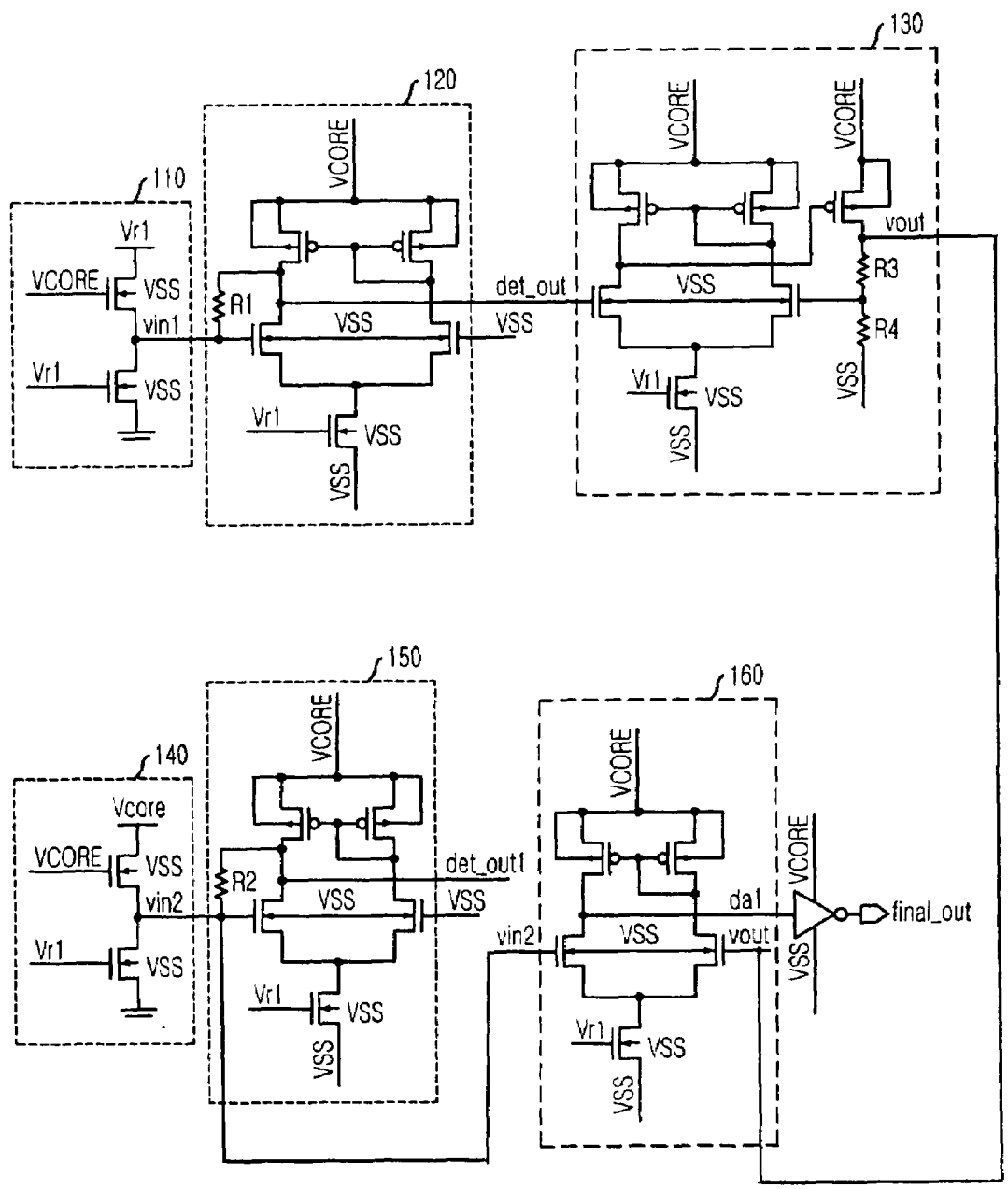
FIG. 1 shows a schematic diagram of a circuit for detecting skew of a transistor in accordance with the present invention.

Referring to FIG. 1, there is shown a schematic diagram of a circuit for detecting skew of a transistor in accordance with the present invention.

The skew detecting circuit includes a linear voltage generating unit 110 consisting of a plurality of switching devices connected to each other in series so as to output a linear voltage based on a first supply voltage Vr1, a first attenuation unit 120 for reducing variation width of the linear voltage according to temperature and skew by receiving the linear voltage through its inverting node and a ground voltage through its non-inverting node, and feeding back its output to the non-inverting node, a saturation voltage generating unit 140 consisting of a plurality of switching devices connected to each other in series to thereby output a saturation voltage based on a second supply voltage VCORE, and a comparison unit 160 for comparing the linear voltage and the saturation voltage. Although it is not necessary, it is preferable to further include a second attenuation unit 150 located at an output node of the saturation voltage generating unit 140, thereby implementing accurate comparison at the comparison unit 160. The second attenuation unit 150 is formed with a similar structure to that of the first attenuation unit 120. Furthermore, it is preferable to include a voltage adjusting unit 130 for adjusting the linear voltage to a certain level to thereby make the comparison of an output of the first attenuation unit 120 and the saturation voltage easier.

In accordance with an embodiment of the present invention, the switching devices used in the linear voltage generating unit 110 and the saturation voltage generating unit 140 can be formed with NMOS transistors.

In accordance with another embodiment of the present invention, the switching devices used in the linear voltage generating unit 110 and the saturation voltage generating unit 140 can be formed with PMOS transistors.

Meanwhile, a drain of an upper switching device in the linear voltage generating unit 110 is connected to the first supply voltage Vr1 whose level is lower than that of the second supply voltage VCORE and, thus, the upper switching device operates in a linear region. On the other hand, a lower switching device operates in a saturation region.

Since a drain of an upper switching device in the saturation voltage generating unit 140 is coupled with the driving voltage VCORE, the upper and the lower switching devices operate in a saturation region.

A feedback resistor R1 in the first attenuation unit 120 plays a role of reducing the variation width of the linear voltage vin1 according to the temperature and the skew. Therefore, hereinafter, the reduction of the variation width will be explained in detail with reference to FIGS. 2 and 3.

Figure 2:
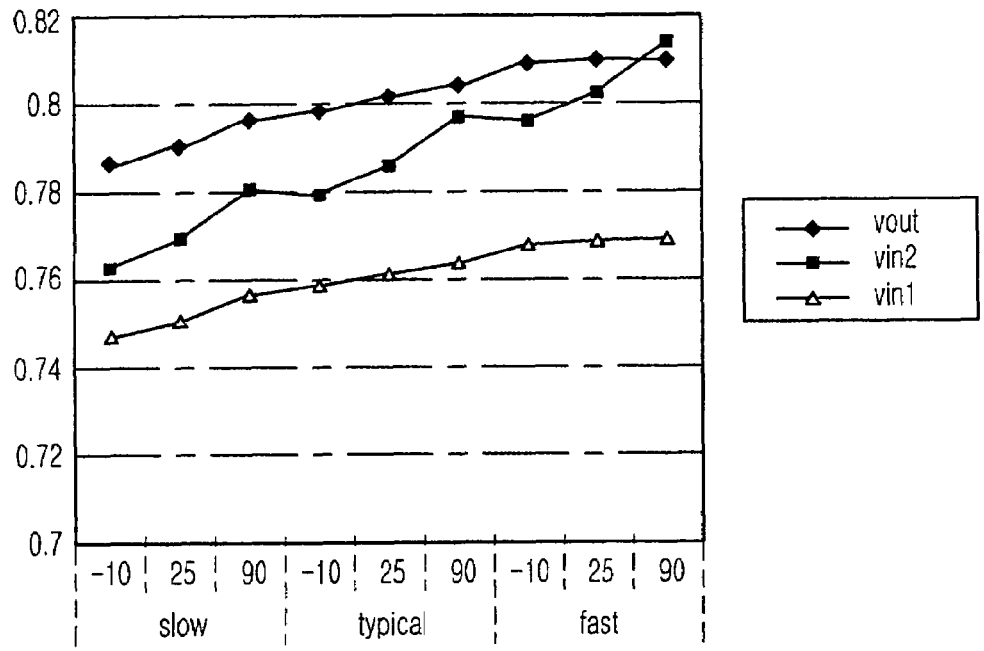
FIG. 2 illustrates a simulation waveform diagram when there is no feedback resistor.
Figure 3:
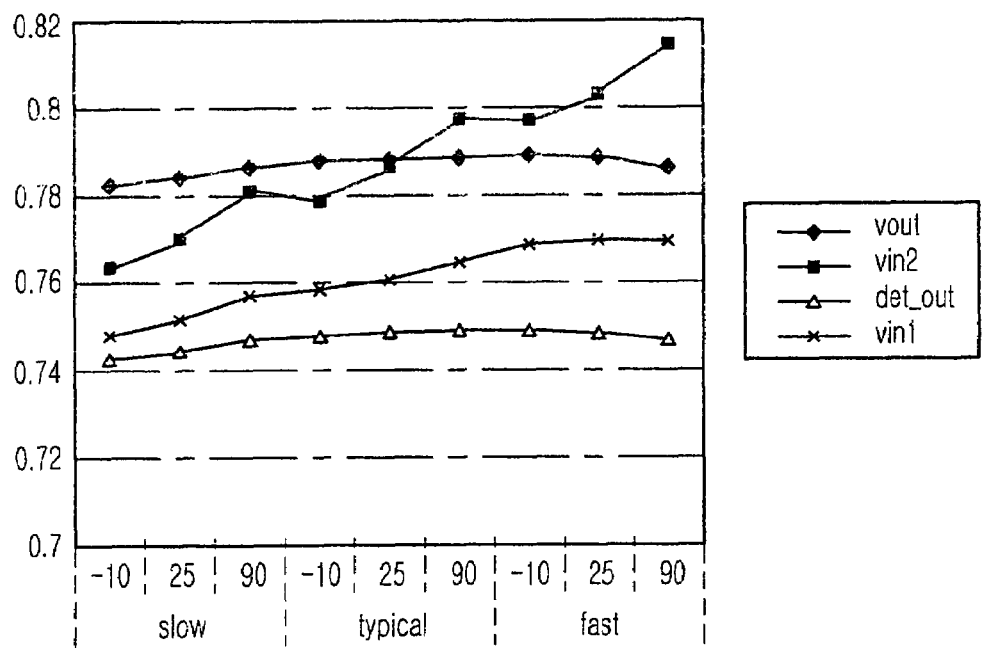
FIG. 3 describes a simulation waveform diagram when there exists a feedback resistor.

FIG. 2 illustrates a simulation waveform diagram when there is not the feedback resistor R1 and FIG. 3 describes a simulation waveform diagram when there exists the feedback resistor R1.

In general, according to a voltage(Vgs)-current(Ids) performance curve of a MOS transistor, as the temperature becomes higher, the current increases when the transistor is in the linear region while the current decreases when the transistor is in the saturation region.

Therefore, when there is no feedback resistor R1 in the first attenuation unit 120, in case that the upper switching device in the linear voltage generating unit 110 acts in the linear region and the lower switching device operates in the saturation region, if the linear voltage vin1 becomes higher when there are temperature rising and skew move from slow to fast, the output voltage of the first attenuation unit 120 also increases in proportion with the increase of the linear voltage vin1.

On the other hand, if there exists the feedback resistor R1 in the first attenuation unit 120, as shown in FIG. 3, the output voltage of the first attenuation unit 120 remains in a certain range since there exists the feedback resistor R1 although the linear voltage vin1 rises according to the temperature rising and the skew move from slow to fast. Therefore, the linear voltage vin1 can be used as a reference voltage which is compared with a saturation voltage vin2 increasing according to the temperature rising and the skew move from slow to fast.

The voltage adjusting unit 130 is used to shift the linear voltage vin1 to a certain level when it is impossible to compare the linear voltage vin1 with the saturation voltage vin2 directly as can be seen from FIG. 3. It is achieved by properly adjusting the resistance of resistors R3 and R4 in the voltage adjusting unit 130. Meanwhile, in accordance with an embodiment of the present invention, the voltage adjusting unit 130 can be omitted by precisely adjusting the resistance of the feedback resistor R1.

Figure 4:
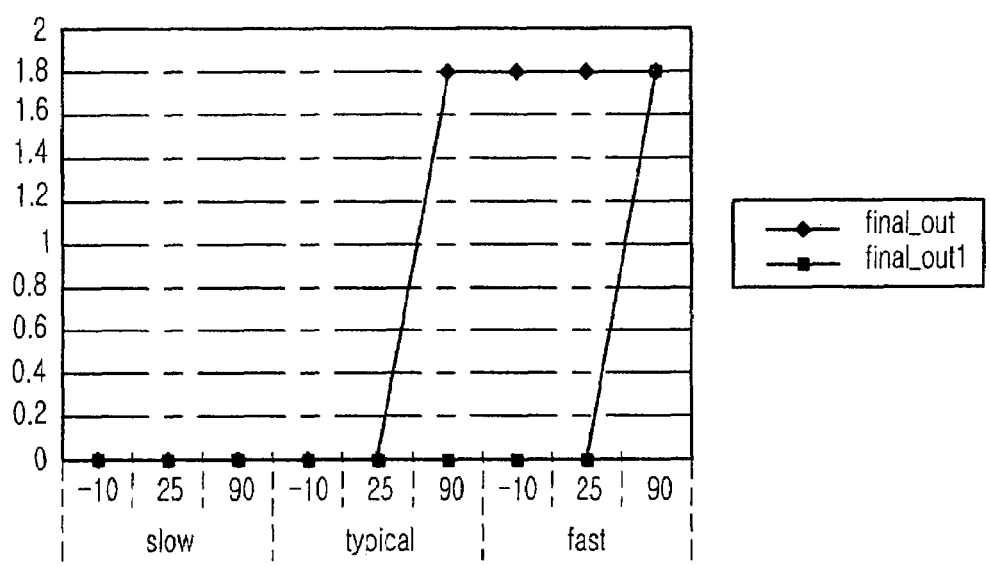
FIG. 4 represents simulation results of the skew detecting circuit in accordance with the present invention.

FIG. 4 represents simulation results of the skew detecting circuit in accordance with the present invention.

In accordance with the present invention, it is possible to independently determine the skew of the transistor since an output final_out has an output value which changes according to the temperature for each skew. For instance, the skew is determined as "fast skew" when the output has 1.8V at all of $-10°$, $25°$ and $90°$; "slow skew", 0V at $-10°$ and $25°$; and "typical skew", 1.8V at $90°$.

That is, an output final_out1 in case of removing the feedback resistor R1 from the inventive circuit has limitation in determining the skew according to the temperature.

In the meantime, in accordance with an embodiment of the present invention, the skew detecting circuit is not limited to a scope described herein and it is possible to detect the skew of all transistors of a wafer at a stroke by applying the inventive circuit to each wafer.

In accordance with another embodiment of the present invention, the inventive skew detecting circuit can detect the skew of transistors existing in a semiconductor device at a stroke.

Since the inventive circuit can detect the skew of transistors precisely, it is possible to ease the consideration about the variation width of the transistors when designing circuits of the semiconductor device. Furthermore, it is possible to compensate the variation width according to the skew and temperature by detecting the skew of the transistors and feeding back the detecting result to each circuit in the semiconductor device.

The present application contains subject matter related to Korean patent application No. 2004-29065, filed in the Korean Patent Office on Apr. 27, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A circuit for detecting skew of transistors, the circuit comprising:
   a linear voltage generating unit including the transistors under test for outputting a linear voltage by using a first supply voltage;
   a first attenuation unit for reducing voltage level variation of the linear voltage according to the performance of the transistors;
   a saturation voltage generating unit for outputting a saturation voltage by using a second supply voltage whose level is higher than that of the first supply voltage;
   a voltage adjusting unit for adjusting an output of the first attenuation unit to a certain voltage level so as to easily compare said output with the saturation voltage; and
   a comparison unit for comparing an output of the voltage adjusting unit and the saturation voltage,
   wherein the first attenuation unit is an operational amplifier whose inverting input node is coupled with the linear voltage and non-inverting input node receives the ground voltage, and which employs a resistor having a resistance between and the inverting input node.

2. The circuit as recited in claim 1, wherein the transistors include a first switching device and a second switching device connected to each other in series, the first switching device operating in a linear region and the second switching device acting in a saturation region.

3. The circuit as recited in claim 2, wherein
the first switching device has a drain coupled with the first supply voltage and a gate receiving the second supply voltage; and
the second switching device has a drain connected to a source of the first switching device, a gate receiving the first supply voltage and a source coupled with a third supply voltage.

4. The circuit as recited in claim 3, wherein the first and the second switching devices are formed with NMOS transistors.

5. The circuit as recited in claim 3, wherein the first and the second switching devices are formed with PMOS transistors.

6. The circuit as recited in claim 1, wherein the saturation voltage generating unit includes a multiplicity of switching devices connected to each other in series, all of the switching devices operating in a saturation region.

7. The circuit as recited in claim 6, wherein the saturation voltage generating unit includes:
a first switching device having a drain coupled with the second supply voltage and a gate receiving the second supply voltage; and
a second switching device having a drain connected to a source of the first switching device, a gate receiving the first supply voltage and a source coupled with a third supply voltage.

8. The circuit as recited in claim 7, wherein the first and the second switching devices are formed with NMOS transistors.

9. The circuit as recited in claim 7, wherein the first and the second switching devices are formed with PMOS transistors.

10. The circuit as recited in claim 1, wherein the voltage adjusting unit is formed with a plurality of resistors, an operational amplifier having a non-inverting input node connected to a central part of the resistors and an inverting input node coupled with the output of the first attenuation unit, and a switching device controlled by a voltage level of an output node of the operational amplifier to provide a given voltage to the resistors.

11. The circuit as recited in claim 1, further comprising a second attenuation unit connected to an output node of the saturation voltage generating unit so as to achieve precise comparison at the comparison unit.

12. A method for detecting skew of transistors under test, the method comprising:
generating a linear voltage by using a first supply voltage;
reducing voltage level variation of the linear voltage according to the performance of the transistors, thereby outputting an attenuated linear voltage;
producing a saturation voltage by using a second supply voltage; and
comparing the attenuated linear voltage and the saturation voltage.

13. The method as recited in claim 12, wherein a level of the first supply voltage is lower than that of the second supply voltage.

14. The method as recited in claim 13, further comprising adjusting the attenuated linear voltage to a certain voltage level so as to easily compare the attenuated linear voltage with the saturation voltage.

* * * * *